(12) United States Patent
Burroughes et al.

(10) Patent No.: US 8,481,994 B2
(45) Date of Patent: Jul. 9, 2013

(54) ORGANIC THIN FILM TRANSISTORS AND METHODS OF MAKING THE SAME

(75) Inventors: Jeremy Burroughes, Cambridge (GB); Craig Murphy, Teddington (GB); Gregory Whiting, Mountain View, CA (US); Jonathan Halls, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 403 days.

(21) Appl. No.: 12/744,499

(22) PCT Filed: Nov. 27, 2008

(86) PCT No.: PCT/GB2008/003941
§ 371 (c)(1),
(2), (4) Date: Oct. 25, 2010

(87) PCT Pub. No.: WO2009/068869
PCT Pub. Date: Jun. 4, 2009

(65) Prior Publication Data
US 2011/0024728 A1 Feb. 3, 2011

(30) Foreign Application Priority Data
Nov. 27, 2007 (GB) .................................. 0723262.2

(51) Int. Cl.
*H01L 35/24* (2006.01)
(52) U.S. Cl.
USPC ..................................... 257/40; 257/E51.001
(58) Field of Classification Search
USPC ............................................ 257/40, E51.001
See application file for complete search history.

(56) References Cited

U.S. PATENT DOCUMENTS

| 2005/0133782 | A1 | 6/2005 | Klauk et al. |
| 2006/0088875 | A1 | 4/2006 | Jackson et al. |
| 2006/0270066 | A1 | 11/2006 | Imahayashi et al. |
| 2006/0289858 | A1 | 12/2006 | Park et al. |

FOREIGN PATENT DOCUMENTS

| EP | 1681733 A1 | 7/2006 |
| EP | 1801882 A2 | 6/2007 |
| GB | 0712269 A | 7/1954 |

OTHER PUBLICATIONS

International Search Report and Written Opinion for PCT/GB2008/003941 dated Mar. 25, 2009.
Search Report for GB0723262.2 dated Mar. 26, 2008.
Braun et al., "Fermi level pinning at interfaces with tetrafluorotetracyanoquinodimethane (F4-TCNQ): The role of integer charge transfer states," *Chemical Physics letters*, 438:259-262 (2007).
Di et al., "High-Performance Low-Cost organic Filed-Effect Transistors with Chemically Modified Bottom electrodes," *J. Am. Chem. Soc.*, 128:16418-16419 (2006).
Kang et al., "Energy level diagrams of $C_{60}$/pentacene/Au and pentacene/$C_{60}$/Au," *Synthetic Metals, Elsevier Sequoia*, 156:32-37 (2006).
Vanoni et al., "Reduction of the contact resistance by doping in pentacene few monolayers thin film transistors and self-assembled nanocrystals," *Applied Physics Letters*, 90:193119-1/193119-3 (2007).
Videlot-Ackermann, "Charge transfer effects in organic field-effect transistors containing a donor/acceptor heterojunction," *Synthetic Metals, Elsevier Sequoia*, 157:551-557 2007.
Wheland et al., "Syntheses of Electrically Conductive Organic Solids," *Journals of the Am,erican Chemical Society*, 98:3916-3925 (1976).

*Primary Examiner* — Anthony Ho
(74) *Attorney, Agent, or Firm* — Marshall, Gerstein & Borun LLP

(57) ABSTRACT

An organic thin film transistor, and a method of making the same, comprising a source and drain electrode and organic semi-conductive material disposed therebetween in a channel region, in which the source and drain electrodes have disposed on them a thin self-assembled layer of a material comprising a dopant moiety for chemically doping the organic semi-conductive material by accepting electrons, the dopant moiety having a redox potential of at least 0.3 eV relative to a saturated calomel electrode in acetonitrile.

21 Claims, 6 Drawing Sheets

ORGANIC THIN FILM TRANSISTORS AND METHODS OF MAKING THE SAME

FIELD OF INVENTION

Aspects of the present invention relate to organic thin film transistors and methods of making the same.

BACKGROUND OF THE INVENTION

Transistors can be divided into two main types: bipolar junction transistors and field-effect transistors. Both types share a common structure comprising three electrodes with a semi-conductive material disposed therebetween in a channel region. The three electrodes of a bipolar junction transistor are known as the emitter, collector and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as P-type and N-type according to whether they comprise semi-conductive material which conducts positive charge carriers (holes) or negative charge carriers (electrons) respectively. The semi-conductive material may be selected according to its ability to accept, conduct, and donate charge. The ability of the semi-conductive material to accept, conduct, and donate holes or electrons can be enhanced by doping the material. The material used for the source and drain electrodes can also be selected according to its ability to accept and injecting holes or electrodes. For example, a P-type transistor device can be formed by selecting a semi-conductive material which is efficient at accepting, conducting, and donating holes, and selecting a material for the source and drain electrodes which is efficient at injecting and accepting holes from the semi-conductive material. Good energy-level matching of the Fermi-level in the electrodes with the HOMO level of the semi-conductive material can enhance hole injection and acceptance. In contrast, an N-type transistor device can be formed by selecting a semi-conductive material which is efficient at accepting, conducting, and donating electrons, and selecting a material for the source and drain electrodes which is efficient at injecting electrons into, and accepting electrons from, the semi-conductive material. Good energy-level matching of the Fermi-level in the electrodes with the LUMO level of the semi-conductive material can enhance electron injection and acceptance.

Transistors can be formed by depositing the components in thin films to form thin film transistors. When an organic material is used as the semi-conductive material in such a device, it is known as an organic thin film transistor.

Various arrangements for organic thin film transistors are known. One such device is an insulated gate field-effect transistor which comprises source and drain electrodes with a semi-conductive material disposed therebetween in a channel region, a gate electrode disposed adjacent the semi-conductive material and a layer of insulting material disposed between the gate electrode and the semi-conductive material in the channel region.

An example of such an organic thin film transistor is shown in FIG. 1. The illustrated structure may be deposited on a substrate 1 and comprises source and drain electrodes 2, 4 which are spaced apart with a channel region 6 located therebetween. An organic semiconductor (OSC) 8 is deposited in the channel region 6 and may extend over at least a portion of the source and drain electrodes 2, 4. An insulating layer 10 of dielectric material is deposited over the organic semi-conductor 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

The structure described above is known as a top-gate organic thin film transistor as the gate is located on a top side of the device. Alternatively, it is also known to provide the gate on a bottom side of the device to form a so-called bottom-gate organic thin film transistor.

An example of such a bottom-gate organic thin film transistor is shown in FIG. 2. In order to more clearly show the relationship between the structures illustrated in FIGS. 1 and 2, like reference numerals have been used for corresponding parts. The bottom-gate structure illustrated in FIG. 2 comprises a gate electrode 12 deposited on a substrate 1 with an insulating layer 10 of dielectric material deposited thereover. Source and drain electrodes 2, 4 are deposited over the insulating layer 10 of dielectric material. The source and drain electrodes 2, 4 are spaced apart with a channel region 6 located therebetween over the gate electrode. An organic semiconductor (OSC) 8 is deposited in the channel region 6 and may extend over at least a portion of the source and drain electrodes 2, 4.

One of the challenges with all organic thin film transistors is to ensure a good ohmic contact between the source and drain electrodes and the organic semiconductor (OSC). This is required to minimize contact resistance when the thin film transistor is switched on. A typical approach to minimize extraction and injection barriers, for a p-channel device, is to choose a material for the source and drain electrodes that has a work function that is well matched to the HOMO level of the OSC. For example, many common OSC materials have a good HOMO level matching with the work function of gold, making gold a relatively good material for use as the source and drain electrode material. Similarly, for an n-channel device, a typical approach to minimize extraction and injection barriers is to choose a material for the source and drain electrodes that has a work function that is well matched to the LUMO level of the OSC.

One problem with the aforementioned arrangement is that a relatively small number of materials will have a work function which has a good match energy level match with the HOMO/LUMO of the OSC. Many of these materials may be expensive, such as gold, and/or may be difficult to deposit to form the source and drain electrodes. Furthermore, even if a suitable material is available, it may not be perfectly matched for a desired OSC, and a change in the OSC may require a change in the material used for the source and drain electrodes.

One known solution is to provide a thin self-assembled dipole layer on the source and drain electrodes to improve the energy level matching. While not being bound by theory, a thin self-assembled dipole layer may provide a field which shifts the energy levels of the material of the source/drain electrodes and/or the energy levels of the OSC near the source/drain electrodes to improve energy level matching between the OSC and the material of the source/drain.

Although the use of a self-assembled dipole layer can improve matching between the energy levels of the source/drain material and the OSC, the energy levels can only be shifted by a few tenths of an electron volt using this technique. As such, the type of material used for the source and drain electrodes is still relatively restricted. It would be advantageous to be able to use a wide range of materials for the source and drain so that materials can be chosen for their process compatibility. Another problem is that if the thin self-assembled dipole layer is disposed not only on the source/drain electrodes, but also in the channel region, then the performance characteristics of the OSC in the channel region can be adversely affected.

Several other approaches have been used in the prior art in order to improve organic thin film transistor performance.

US 2005/133782 discloses doping of source/drain palladium metal by using of benzo-nitrile or substituted benzo nitriles such as Tetracyanoquinodimethane (TCNQ) in order to facilitate the transfer of charge between the organic semiconductor and the source/drain electrode surface. In contrast to the dipole layers discussed above which merely alter the energy levels of the OSC and/or source and drain using a field effect, the benzo-nitriles chemically dope the OSC by accepting electrons (p-doping). As such, the conductivity of the OSC near the electrodes is increased and charge transfer is facilitated to a much larger extent than utilizing the aforementioned dipole layers.

*J. Am. Chem. Soc.*, 2006, 128, 16418-16419 also discloses use of TCNQ on either Ag or Cu contacts to locally dope a pentacene OSC giving good transistor properties.

The nitriles are used directly in the aforementioned prior art without being functionalized with groups specially designed for attachment to the source/drain metal. It is described that the dopant nitrile groups can themselves bond to source/drain palladium metal and unbonded dopant can be removed by washing to leave the dopant nitrile groups attached to the source/drain but not in the channel.

The present applicant has found that it is advantageous to improve the binding of dopant moieties such as TCNQ to the source/drain electrodes by providing an attachment moiety bonded to the dopant moiety. This is described in the applicant's earlier application GB-A-0712269.0. GB-A-0712269.0 also disclosed that fluorinated derivatives of TCNQ such as tetrafluoro-tetracyanoquinodimethane (F4-TCNQ) could be used as these dopant moieties were found by the applicant to be particularly good at accepting electrons from the OSC due to its very deep LUMO.

It is an aim of certain embodiments of the present invention to provide an improved organic thin film transistor and an improved method of treating source/drain electrodes in order to provide a good ohmic contact between the source/drain electrodes and the organic semiconductor material in an organic thin film transistor.

It is a further aim of the present invention to provide a method of forming an organic thin film transistor with good ohmic contact by a solution processing method.

SUMMARY OF THE INVENTION

Following their work described in GB-A-0712269.0, the applicant has surprising found that if a dopant with a very deep LUMO level is used, such as a fluorinated derivative of TCNQ rather than the previously described TCNQ dopants, then selective binding to the source/drain electrodes is improved negating the requirement for a separate attachment moiety. It is believed that the mechanism for improved binding to the source/drain electrodes is the same as that for improved doping of the OSC. The very low LUMO level dopants are good at accepting electrons from the OSC due to their very deep LUMO leading to better doping of the OSC. Similarly, the very low LUMO level dopants are good at attracting electrons from the source/drain electrodes due to their very deep LUMO leading to better bonding of the dopants to the source/drain electrodes. In addition, the applicant has surprisingly found that the very low LUMO level dopants improve wetting characteristics of the source/drain electrodes for OSC solution deposited thereover when compared with higher LUMO level dopants such as TCNQ. For example, it has been found that if TCNQ is used as a source/drain dopant, when OSC is dispensed onto the surface from a solution in a solvent it will only tend to wet the area between the source/drain electrodes and completely avoid the source/drain metal areas. As such, a large quantity of OSC solution has to be used in order to obtain coverage of the source/drain electrode areas. Furthermore, the OSC tends to de-wet from the electrodes after being deposited requiring a very quick baking step to dry the OSC in order to avoid the OSC solution de-wetting from the electrodes in its fluid state. In contrast, if a very low LUMO level dopant is used, such as F4-TCNQ, the OSC solution readily wets over the source/drain electrodes and doesn't de-wet therefrom after deposition. While not being bound by theory, the reason for improved wetting of the OSC may be the stronger driving force for doping of the OSC in the case of very low LUMO level dopants, improved adhesion of the very low LUMO level dopants to the source/drain electrodes, or a combination of the two.

In light of the above, and in accordance with a first aspect of the present invention there is provided an organic thin film transistor comprising a source and drain electrode and organic semi-conductive material disposed therebetween in a channel region, wherein the source and drain electrodes have disposed thereon a thin self-assembled layer of a material comprising a dopant moiety for chemically doping the organic semi-conductive material by accepting electrons, the dopant moiety having a redox potential of at least 0.3 eV relative to a saturated calomel electrode (SCE) in acetonitrile. More preferably, the redox potential of the dopant moiety is at least 0.4 relative to a saturated calomel electrode and most preferably the redox potential of the dopant moiety is at least 0.5 relative to a saturated calomel electrode.

Various electron acceptors and their redox potentials are given in *J. Am. Chem. Soc.*, 1976, 98:13, 3916-3925. See, for example, Table IV of this document which gives a value of 0.53 for $TCNQF_4$ and a value of only 0.17 for TCNQ relative to a saturated calomel electrode in acetonitrile. While $TCNQF_4$ has been found to be useful as a source/drain dopant in accordance with the present invention, other electron acceptors which may be suitable for use as dopants in accordance with embodiments of the present invention are also disclosed in Table IV, for example, $TCNQ(CN)_2$ and other halogenated derivates of TCNQ such as $TCNQCl_2$ and $TCNQBr_2$. Derivatives, such as fluorinated derivates, of other electron acceptors may also be used, for example, fluorinated derivatives of anthraquinone, perylenebisimide and tetracyanoanthraquinodimethane. Other electron withdrawing substituents for increasing electron affinity of a dopant include nitro ($—NO_2$) and cyano (—ON) groups.

Embodiments of the present invention provide an improvement over the TCNQ dopants disclosed in US 2005/133782 in that the dopants have better selective binding to source/drain electrodes, better wettability of the OSC on the source/drain electrodes, and improved charge mobility of the OSC due to better doping.

The present invention allows a wide range of materials to be used to define the source/drain contacts and associated metal tracking which this layer is also expected to provide— in particular silver, any alloys thereof. Materials can be selected for their conductivity and processing benefits without the requirement for a work function of the material to match a specific OSC energy level. This will allow commonly used source/drain electrode materials such as gold (and palladium) to be replaced by low cost materials that are easier to pattern.

In addition to the above, it has been found that heavy metals such as gold tend to diffuse into the OSC and detrimentally affect the functional properties of the OSC during operation of organic thin film transistors. The present invention allows source/drain materials to be selected which do not suffer from these detrimental diffusion effects.

The very low LUMO level dopant moieties strongly bind to the source/drain electrode and prevent diffusion away from the source/drain in operation or removal of the dopant moiety in a washing step when removing excess dopant from other areas of the device such as the channel region. Furthermore, the dopant moieties may lower the effective workfunction of the source and drain electrodes as compared to the untreated metal.

The dopant moiety is electron-accepting for accepting electrons from the organic semi-conductive material whereby the organic semi-conductive material is p-doped. The HOMO of the organic semi-conductive material is preferably higher (i.e. less negative) than the LUMO of the dopant. This provides better electron transfer from the HOMO of the organic semi-conductive material to the LUMO of the dopant. However, charge transfer is still observed if the HOMO of the organic semi-conductive material is only slightly lower than the LUMO of the dopant. By using a dopant with a very low LUMO level, organic semi-conductive material with a deeper HOMO level can be used than would otherwise be the case. For example, organic semi-conductive material which would not be significantly doped by TCNQ because its HOMO level is below that of the LUMO level of TCNQ may be used. The present applicant has found that this is particularly advantageous because organic semi-conductive material with a deeper (more negative) HOMO level is more stable. As such, according to embodiments of the present invention, the organic semi-conductive material preferably has a HOMO level which is deeper than the LUMO level of TCNQ but most preferably less deep than the LUMO level of the dopant of the present invention.

Preferably, the dopant is a charge neutral dopant rather than an ionic species such as protonic acid doping agents. Providing a high concentration of acid adjacent the electrodes may cause etching of the electrodes with the release of electrode material which may degrade the overlying organic semi-conductive material. Furthermore, the acid may interact with organic semi-conductive material resulting in charge separation which is detrimental to device performance. As such, a charge neutral dopant such as substituted TCNQ is preferred.

Preferably, the organic semi-conductive material is solution processable in order that they may be deposited by, for example, inkjet printing. Solution processable materials include polymers, dendrimers and small molecules.

Preferably, the substituted TCNQ is a fluorinated derivative, for example, tetrafluoro-tetracyanoquinodimethane (F4-TCNQ). It has been found that this derivative is particularly good at doping OSC, binding to source/drain electrodes, and providing a readily wettable surface for the OSC.

The conductivity of the composition is preferably in the range $10^{-6}$ S/cm to $10^{-2}$ S/cm adjacent the electrodes. However, the conductivity of the compositions can be readily varied by altering the concentration of dopant, or by using a different organic semiconductive material and/or dopant, according to the particular conductivity value desired for a particular use.

For a bottom-gate device an organic dielectric material may be utilized to provide a large differential in the chemical properties of the dielectric layer and the source and drain electrodes such that selective binding of the dopant moiety to the source and drain electrodes is encouraged.

Similarly, for a top-gate device an organic substrate may be utilized to provide a large differential in the chemical properties of the dielectric layer and the source and drain electrodes such that selective binding of the dopant moiety to the source and drain electrodes is encouraged.

In another arrangement, the dielectric layer or the substrate may be treated to enhance the selective binding of the dopant moiety to the source and drain electrodes as opposed to the dielectric layer or the substrate.

In accordance with a second aspect of the present invention there is provided a method of manufacturing an organic thin film transistor as previously described, the method comprising: depositing a source and drain electrode; forming a thin self-assembled layer of material on the source and drain electrodes, the thin self-assembled layer of material comprising a dopant moiety for chemically doping an organic semi-conductive material by accepting electrons; and depositing an organic semi-conductive material in a channel region between the source and drain electrode, wherein the dopant moiety has a redox potential of at least 0.3 eV relative to a saturated calomel electrode (SCE) in acetonitrile. The organic semi-conductive material is preferably deposited from solution.

SUMMARY OF THE DRAWINGS

The present invention will now be described in further detail, by way of example only, with reference to the accompanying drawings in which.

DETAILED DESCRIPTION OF PREFERRED EMBODIMENTS

Figure 3:
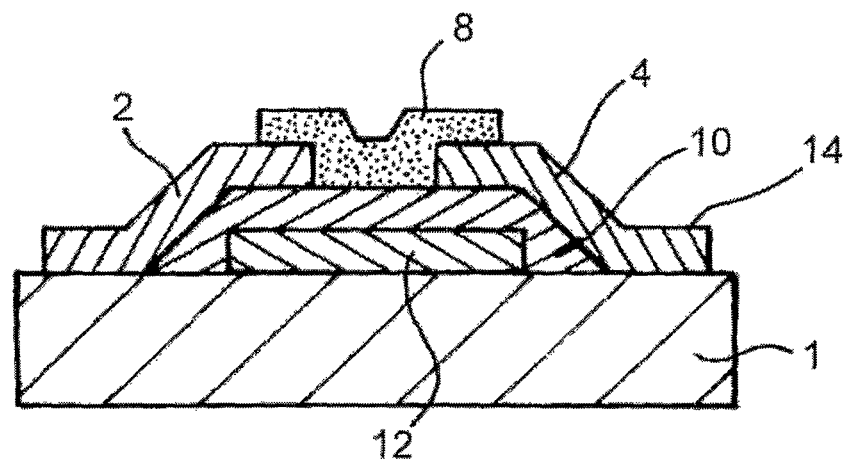
FIG. 3 shows a bottom-gate organic thin film transistor according to an embodiment of the present invention.

FIG. 3 shows a bottom-gate organic thin film transistor according to an embodiment of the present invention. The structure is similar to the prior art arrangement shown in FIG.

2 and for clarity like reference numerals have been used for like parts. The key difference between the arrangement shown in FIG. 3 is that the source and drain electrodes 2, 4 have disposed thereon a thin self-assembled layer of a material 14 comprising a dopant moiety having a redox potential of at least 0.3 eV relative to a saturated calomel electrode (SCE) in acetonitrile.

Figure 1:
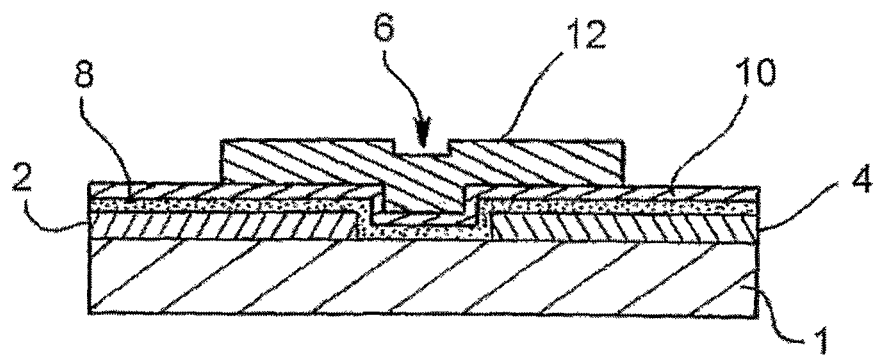
FIG. 1 shows a known top-gate organic thin film transistor arrangement.
Figure 2:
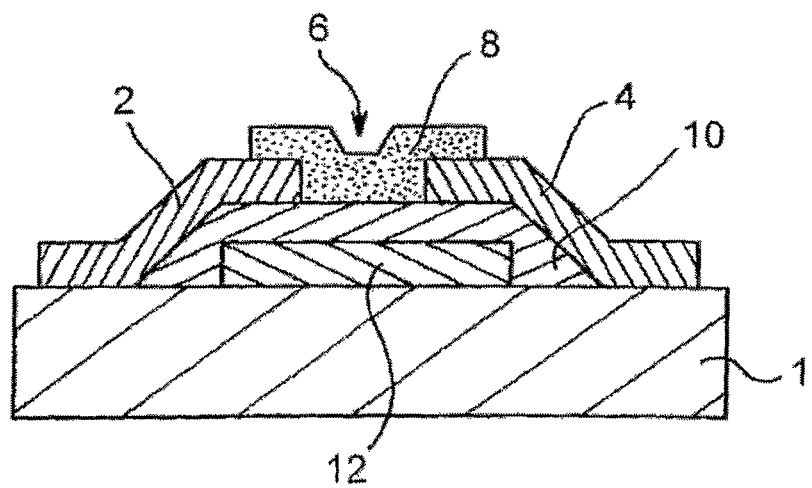
FIG. 2 shows a known bottom-gate organic thin film transistor arrangement.
Figure 4:
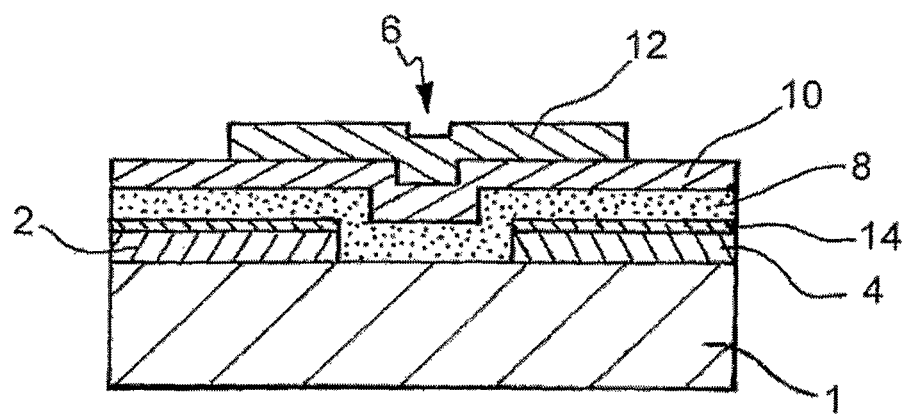
FIG. 4 shows a top-gate organic thin film transistor according to an embodiment of the present invention.

FIG. 4 shows a top-gate organic thin film transistor according to an embodiment of the present invention. The structure is similar to the prior art arrangement shown in FIG. 1 and for clarity like reference numerals have been used for like parts. Again, the key difference between the arrangement shown in FIG. 4 is that the source and drain electrodes 2, 4 have disposed thereon a thin self-assembled layer of a material 14 comprising a dopant moiety having a redox potential of at least 0.3 eV relative to a saturated calomel electrode (SCE) in acetonitrile.

Figure 5:
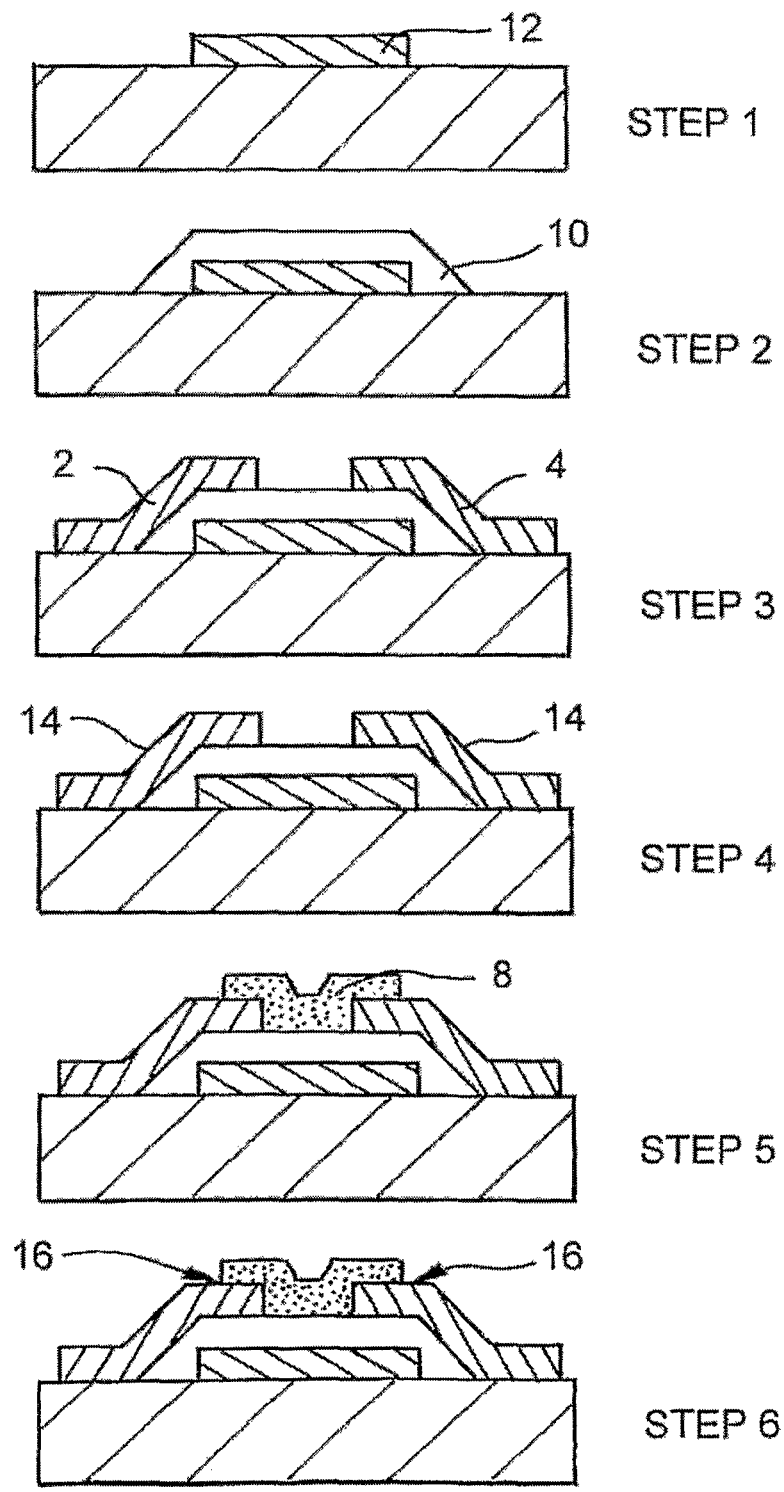
FIG. 5 illustrates the method steps involved in forming an organic thin film transistor according to the embodiment illustrated in FIG. 3.

The bottom-gate implementation illustrated in FIG. 3 is formed using the method illustrated in FIG. 5 in which schematic cross sections are shown.

Gate deposition and patterning 12 (e.g. patterning of an ITO-coated substrate).

Dielectric deposition and patterning 10 (e.g. cross-linkable, photopatternable dielectrics).

Source-drain material deposition and patterning 2, 4 (e.g. silver, photolithography).

Source-drain surface treatment 14. The surface treatment groups could be applied by dipping the substrate into a solution of the self-assembled material, or applying by spin coating from a dilute solution. Excess (un-attached) material can be removed by washing. Use of a hydrophobic organic dielectric allows selectivity and prevents the dopant moieties from attaching themselves to the channel region. If the channel region becomes doped the thin film transistor will allow current to flow from source to drain with the transistor in its off state. [Note that in order to make a depletion thin film transistor, for which a gate bias is applied to turn the transistor off, this effect could be a desirable route for controlled doping of the OSC in the channel region.]

Deposition of the OSC 8 (e.g. by ink jet printing of a solution processable polymer).

The dopant molecules interact with the OSC where they are in contact 16. For an acceptor dopant with a deep LUMO, electrons are transferred from the OSC to the dopant, rendering a localized region of the OSC conducting. This improves injection and extraction of charges at the source and drain contacts.

This technique is also compatible with top-gate devices. In this case, the source-drain layer is deposited and patterned first. The surface treatment is then applied to the source-drain layer prior to OSC, gate dielectric and gate deposition. A dopant moiety is selected that does not attach itself to the exposed substrate in the region of the source-drain channel.

A treatment may be applied in specific locations to prevent attachment of the dopant. This may be required to prevent attachment to the channel region if selectively cannot be achieved directly.

Where the source-drain metal needs to be exposed (e.g. for electrical connection to a subsequent conducting layer) the dopant layer may need to be removed (e.g. by direct photopatterning of a photo-reactive attachment group, laser ablation, etc) or prior surface patterning may be required to define where the dopant layer is required. Alternatively, if the dopant layer is thin and conducting enough, the dopant can be left in situ without impeding conducting via formation.

Other features of OTFTs in accordance with embodiments of the present invention are discussed below.

Substrate

The substrate may be rigid or flexible. Rigid substrates may be selected from glass or silicon and flexible substrates may comprise thin glass or plastics such as poly(ethylene terephthalate) (PET), poly(ethylene-naphthalate) PEN, polycarbonate and polyimide.

The organic semiconductive material may be made solution processable through the use of a suitable solvent. Exemplary solvents include mono- or poly-alkylbenzenes such as toluene and xylene; tetralin; and chloroform. Preferred solution deposition techniques include spin coating and ink jet printing. Other solution deposition techniques include dip-coating, roll printing and screen printing.

Organic Semiconductor Materials

Preferred organic semiconductor materials include small molecules such as optionally substituted pentacene; optionally substituted polymers such as polyarylenes, in particular polyfluorenes and polythiophenes; and oligomers. Blends of materials, including blends of different material types (e.g. a polymer and small molecule blend) may be used.

Source and Drain Electrodes

For a p-channel OTFT, preferably the source and drain electrodes comprise a high workfunction material, preferably a metal, with a workfunction of greater than 3.5 eV, for example gold, platinum, palladium, molybdenum, tungsten, or chromium. More preferably, the metal has a workfunction in the range of from 4.5 to 5.5 eV. Other suitable compounds, alloys and oxides such as molybdenum trioxide and indium tin oxide may also be used. The source and drain electrodes may be deposited by thermal evaporation and patterned using standard photolithography and lift off techniques as are known in the art.

Alternatively, conductive polymers may be deposited as the source and drain electrodes. An example of such a conductive polymers is poly(ethylene dioxythiophene) (PEDOT) although other conductive polymers are known in the art. Such conductive polymers may be deposited from solution using, for example, spin coating or ink jet printing techniques and other solution deposition techniques discussed above.

The source and drain electrodes are preferably formed from the same material for ease of manufacture. However, it will be appreciated that the source and drain electrodes may be formed of different materials for optimization of charge injection and extraction respectively.

The length of the channel defined between the source and drain electrodes may be up to 500 microns, but preferably the length is less than 200 microns, more preferably less than 100 microns, most preferably less than 20 microns.

Gate Electrode

The gate electrode can be selected from a wide range of conducting materials for example a metal (e.g. gold) or metal compound (e.g. indium tin oxide). Alternatively, conductive polymers may be deposited as the gate electrode. Such conductive polymers may be deposited from solution using, for example, spin coating or ink jet printing techniques and other solution deposition techniques discussed above Thicknesses of the gate electrode, source and drain electrodes may be in the region of 5-200 nm, although typically 50 nm as measured by Atomic Force Microscopy (AFM), for example.

Insulating Layer (Gate Dielectric)

The insulating layer comprises a dielectric material selected from insulating materials having a high resistivity. The dielectric constant, k, of the dielectric is typically around 2-3 although materials with a high value of k are desirable because the capacitance that is achievable for an OTFT is directly proportional to k, and the drain current $I_D$ is directly proportional to the capacitance. Thus, in order to achieve high drain currents with low operational voltages, OTFTs with thin dielectric layers in the channel region are preferred.

The dielectric material may be organic or inorganic. Preferred inorganic materials include Si02, SiNx and spin-on-glass (SOG). Preferred organic materials are generally polymers and include insulating polymers such as poly vinylalcohol (PVA), polyvinylpyrrolidine (PVP), acrylates such as polymethylmethacrylate (PMMA) and benzocyclobutanes (BCBs) available from Dow Corning. The insulating layer may be formed from a blend of materials or comprise a multi-layered structure.

The dielectric material may be deposited by thermal evaporation, vacuum processing or lamination techniques as are known in the art. Alternatively, the dielectric material may be deposited from solution using, for example, spin coating or ink jet printing techniques and other solution deposition techniques discussed above.

If the dielectric material is deposited from solution onto the organic semiconductor, it should not result in dissolution of the organic semiconductor. Likewise, the dielectric material should not be dissolved if the organic semiconductor is deposited onto it from solution. Techniques to avoid such dissolution include: use of orthogonal solvents, that is use of a solvent for deposition of the uppermost layer that does not dissolve the underlying layer; and crosslinking of the underlying layer.

The thickness of the insulating layer is preferably less than 2 micrometers, more preferably less than 500 nm.

Further Layers

Other layers may be included in the device architecture. For example, a self assembled monolayer (SAM) may be deposited on the gate, source or drain electrodes, substrate, insulating layer and organic semiconductor material to promote crystallity, reduce contact resistance, repair surface characteristics and promote adhesion where required. In particular, the dielectric surface in the channel region may be provided with a monolayer comprising a binding region and an organic region to improve device performance, e.g. by improving the organic semiconductor's morphology (in particular polymer alignment and crystallinity) and covering charge traps, in particular for a high k dielectric surface. Exemplary materials for such a monolayer include chloro- or alkoxy-silanes with long alkyl chains, eg octadecyltrichlorosilane.

OTFT Applications

OTFTs according to embodiments of the present invention have a wide range of possible applications. One such application is to drive pixels in an optical device, preferably an organic optical device. Examples of such optical devices include photoresponsive devices, in particular photodetectors, and light-emissive devices, in particular organic light emitting devices. OTFTs are particularly suited for use with active matrix organic light emitting devices, e.g. for use in display applications.

Figure 6:
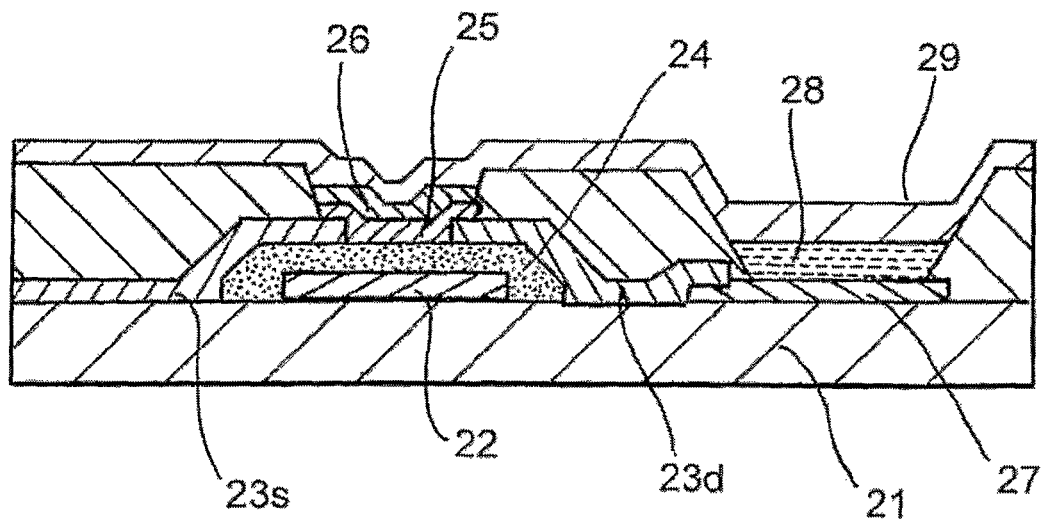
FIG. 6 illustrates a portion of an active matrix organic light emitting display comprising an organic thin film transistor and an organic light emitting device.

FIG. 6 shows a pixel comprising an organic thin film transistor and an adjacent organic light emitting device fabricated on a common substrate 21. The OTFT comprises gate electrode 22, dielectric layer 24, source and drain electrodes 23s and 23d respectively, and OSC layer 25. The OLED comprises anode 27, cathode 29 and an electroluminescent layer 28 provided between the anode and cathode. Further layers may be located between the anode and cathode, such as charge transporting, charge injecting or charge blocking layers. In the embodiment of FIG. 6, the layer of cathode material extends across both the OTFT and the OLED, and an insulating layer 26 is provided to electrically isolate the cathode layer 29 from the OSC layer 25. The active areas of the OTFT and the OLED are defined by a common bank material formed by depositing a layer of photoresist on substrate 21 and patterning it to define OTFT and OLED areas on the substrate.

In this embodiment, the drain electrode 23d is directly connected to the anode of the organic light emitting device for switching the organic light emitting device between emitting and non-emitting states.

Figure 7:
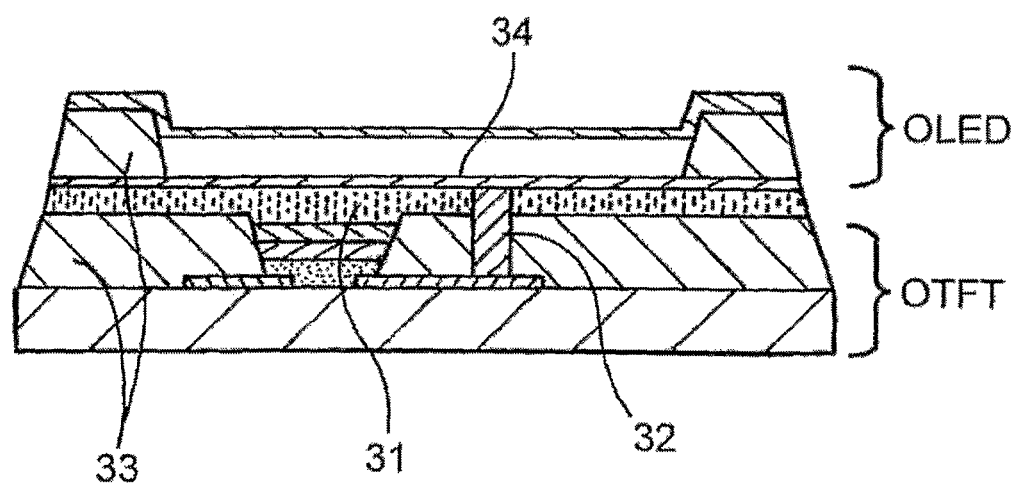
FIG. 7 illustrates a portion of another active matrix organic light emitting display arrangement comprising an organic thin film transistor and an organic light emitting device.

In an alternative arrangement illustrated in FIG. 7, an organic thin film transistor may be fabricated in a stacked relationship to an organic light emitting device. In such an embodiment, the organic thin film transistor is built up as described above in either a top or bottom gate configuration. As with the embodiment of FIG. 6, the active areas of the OTFT and OLED are defined by a patterned layer of photoresist 33, however in this stacked arrangement, there are two separate bank layers 33—one for the OLED and one for the OTFT. A planarization layer 31 (also known as a passivation layer) is deposited over the OTFT. Exemplary passivation layers include BCBs and parylenes. An organic light emitting device is fabricated over the passivation layer. The anode 34 of the organic light emitting device is electrically connected to the drain electrode of the organic thin film transistor by a conductive via 32 passing through passivation layer 31 and bank layer 33.

It will be appreciated that pixel circuits comprising an OTFT and an optically active area (e.g. light emitting or light sensing area) may comprise further elements. In particular, the OLED pixel circuits of FIGS. 6 and 7 will typically comprise least one further transistor in addition to the driving transistor shown, and at least one capacitor.

It will be appreciated that the organic light emitting devices described herein may be top or bottom-emitting devices. That is, the devices may emit light through either the anode or cathode side of the device. In a transparent device, both the anode and cathode are transparent. It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminum.

Transparent cathodes are particularly advantageous for active matrix devices because emission through a transparent anode in such devices may be at least partially blocked by OTFT drive circuitry located underneath the emissive pixels as can be seen from the embodiment illustrated in FIG. 7.

While this invention has been particularly shown and described with reference to preferred embodiments thereof, it will be understood by those skilled in the art that various changes in form and details may be made therein without departing from the scope of the invention as defined by the appended claims.

Experimental Results

Three sets of OTFT devices were manufactured utilizing the same materials and layer structure with the exception that a first set of devices comprised bare silver source and drain electrodes, a second set of devices comprised silver source and drain electrodes coated with a TCNQ dopant, and a third set of devices comprised silver source and drain electrodes coated with an F4TCNQ dopant. The charge mobility of each of the devices was measured and the results are illustrated in FIG. 8.

Figure 8:
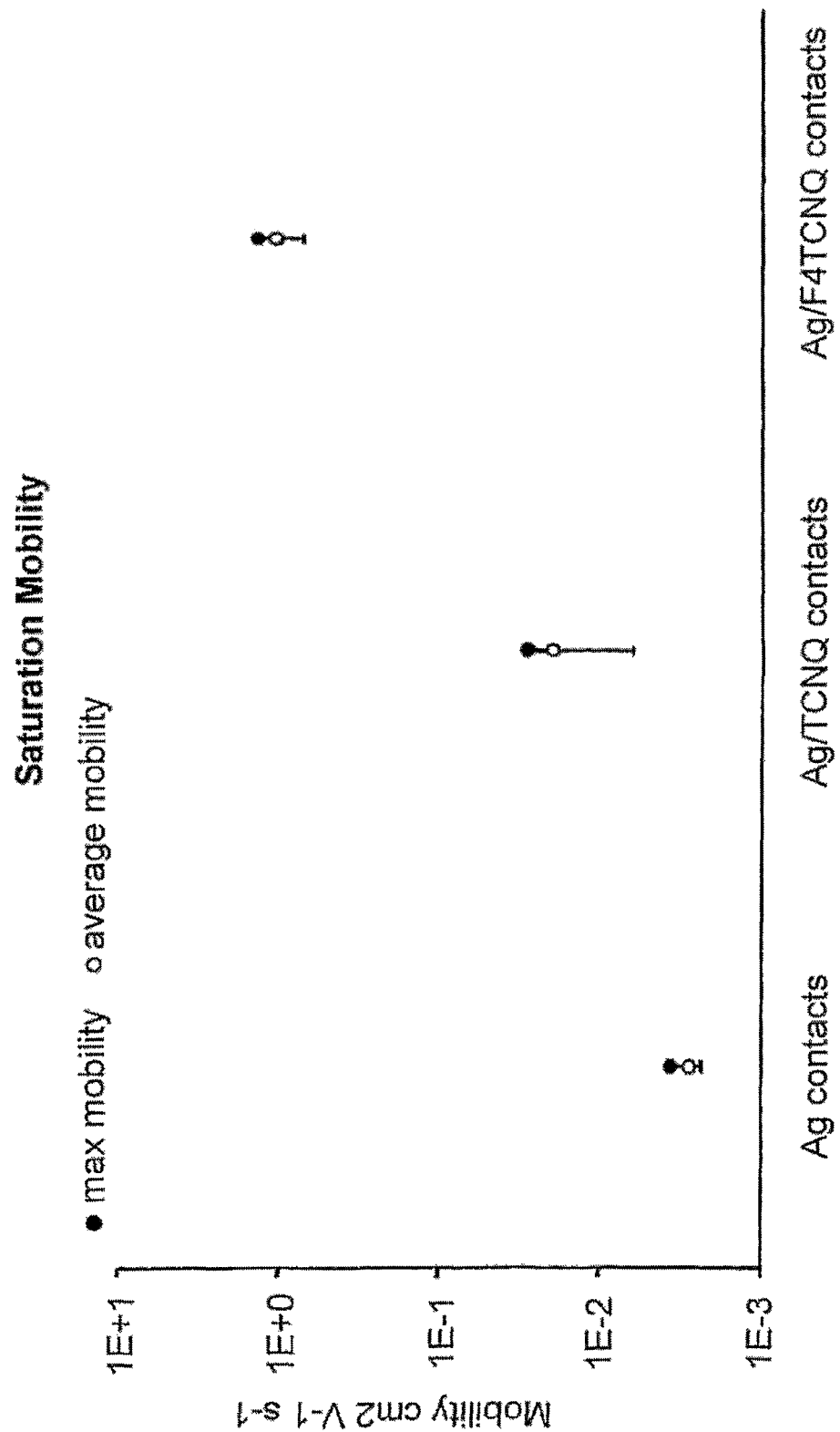
FIG. 8 illustrates the difference in charge mobility between OTFT devices comprising silver source/drain electrodes, OTFT devices comprising silver source/drain electrodes coated with TCNQ, and OTFT devices comprising silver source/drain electrodes coated with F4TCNQ.

As can be seen from FIG. 8, the charge mobility of the devices with the F4TCNQ dopant is the best.

During device manufacture is was observed that there was noticeable dewetting of the OSC from the source/drain electrodes in the devices comprising bare silver or silver/TCNQ electrodes when compared with the devices comprising silver/F4TCNQ electrodes. To quantify this observation, another set of experiments was performed in which three sets of substrates were prepared, a first set comprising a bare silver surface, a second set comprising a silver surface coated with TCNQ, and a third set comprising a silver surface coated with F4TCNQ. A droplet of water was deposited on each of the substrates and the contact angle of a droplet of water under air was measured. The results are illustrated in FIG. 9.

Figure 9:
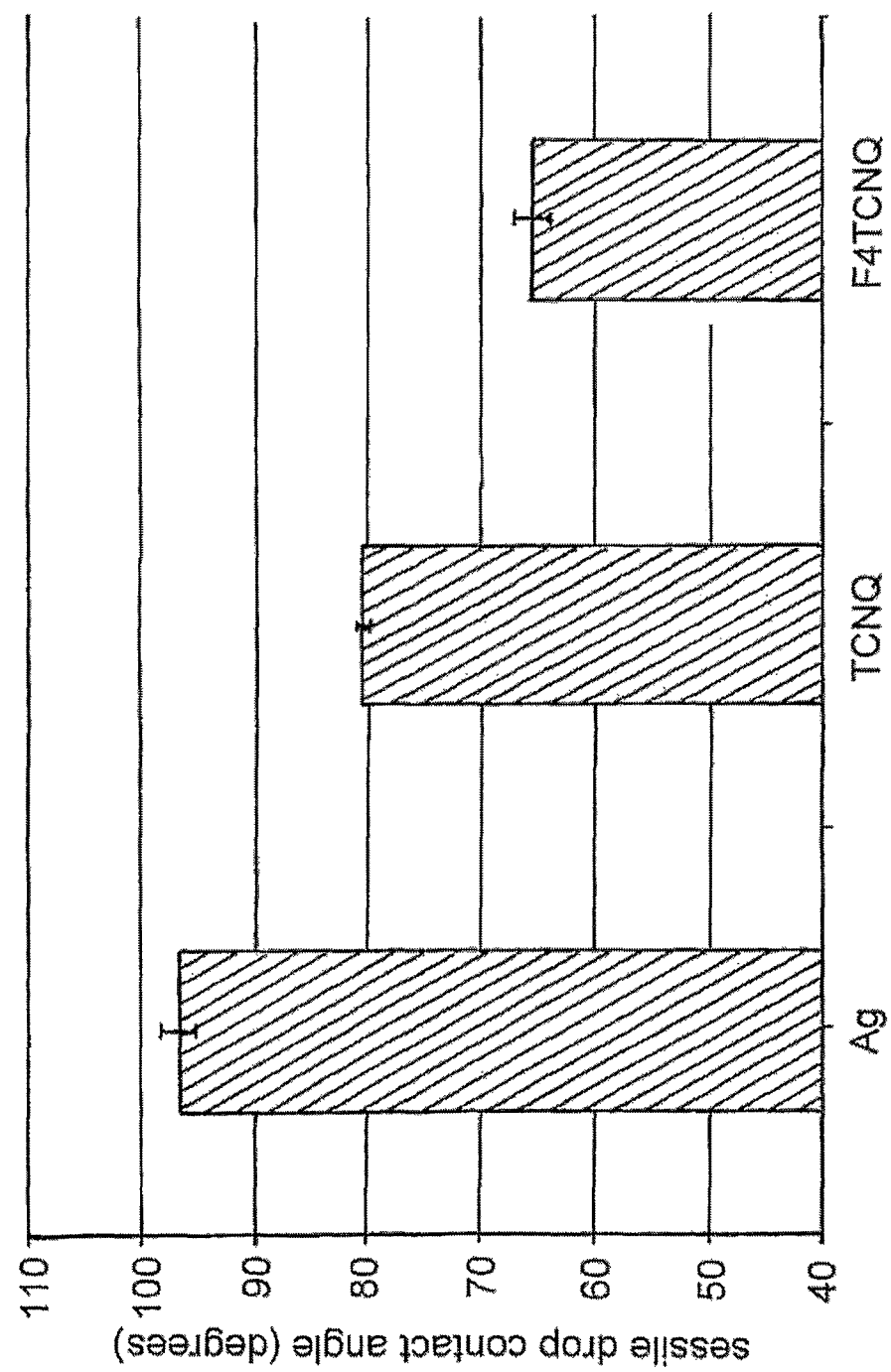
FIG. 9 illustrates the difference in contact angle of a water droplet deposited on a silver surface, on a silver surface coated with TCNQ, and on a silver surface coated with F4TCNQ.

As can be seen from FIG. 9, the contact angle for the F4TCNQ treated surface is the lowest. The lower contact angle explains the observation that during manufacture of an OTFT device, the OSC solution wets electrodes coated with F4TCNQ better than bare silver or silver coated with TCNQ.

The invention claimed is:

1. An organic thin film transistor comprising source and drain electrodes and organic semi-conductive material disposed therebetween in a channel region, wherein the source and drain electrodes have disposed thereon a thin self-assembled layer of a material comprising a dopant moiety for chemically doping the organic semi-conductive material by accepting electrons, the dopant moiety having a redox potential of at least 0.3 eV relative to a saturated calomel electrode in acetonitrile.

2. An organic thin film transistor according to claim 1, wherein the redox potential of the dopant moiety is at least 0.4 eV relative to a saturated calomel electrode in acetonitrile.

3. An organic thin film transistor according to claim 2, wherein the redox potential of the dopant moiety is at least 0.5 eV relative to a saturated calomel electrode in acetonitrile.

4. An organic thin film transistor according to claim 1, wherein the dopant moiety is a charge neutral dopant.

5. An organic thin film transistor according claim 1, wherein the dopant moiety is substituted with at least one of a halogen, nitro, or CN group.

6. An organic thin film transistor according claim 5, wherein the dopant moiety is substituted with more than one halogen, nitro or CN group.

7. An organic thin film transistor according to claim 5, wherein the dopant moiety is substituted with fluorine.

8. An organic thin film transistor according to claim 1, wherein the dopant moiety is a substituted tetracyanoquinodimethane, anthraquinone, perylenebisimide, or tetracyanoanthraquinodimethane.

9. An organic thin film transistor according to claim 1, wherein the thin self-assembled layer is a self assembled mono-layer.

10. An organic thin film transistor according to claim 1, wherein the organic semi-conductive material has a highest occupied molecular orbital (HOMO) level that is deeper than the LUMO level of tetracyanoquinodimethane (TCNQ).

11. An organic thin film transistor according to claim 1, wherein the organic semi-conductive material has a highest occupied molecular orbital (HOMO) level that is shallower than the lowest unoccupied molecular orbital (LUMO) level of the dopant moiety.

12. An organic thin film transistor according to claim 1, wherein the organic semi-conductive material is solution processable.

13. An organic thin film transistor according to claim 1, wherein doped organic semi-conductive material adjacent the source and drain electrodes has a conductivity in the range $10^{-6}$ S/cm to $10^{-2}$ S/cm.

14. An organic thin film transistor according to claim 1, wherein the organic thin film transistor is a bottom-gate device comprising a gate electrode disposed on a substrate and a layer of dielectric material disposed over the gate electrode, the source and drain electrodes being disposed over the dielectric material.

15. An organic thin film transistor according to claim 14, wherein the dielectric material comprises an organic dielectric material.

16. An organic thin film transistor according to claim 14, wherein the layer of dielectric material is treated to enhance selective binding of the dopant moiety to the source and drain electrodes.

17. An organic thin film transistor according to claim 1, wherein the organic thin film transistor is a top-gate device in which the source and drain electrodes are disposed on a substrate, the organic semi-conductive material is disposed over the source and drain electrodes and in the channel region therebetween, a dielectric material is disposed over the organic semi-conductive material and a gate electrode is disposed over the dielectric material.

18. An organic thin film transistor according to claim 17, wherein the substrate comprises an organic dielectric material.

19. An organic thin film transistor according to claim 17, wherein the substrate is treated to enhance selective binding of the dopant moiety to the source and drain electrodes.

20. A method of manufacturing an organic thin film transistor comprising source and drain electrodes and organic semi-conductive material disposed therebetween in a channel region, wherein the source and drain electrodes have disposed thereon a thin self-assembled layer of a material comprising a dopant moiety for chemically doping the organic semi-conductive material by accepting electrons, the method comprising: depositing the source and drain electrodes; forming the thin self-assembled layer of material on the source and drain electrodes, the thin self-assembled layer of material comprising the dopant moiety for chemically doping the organic semi-conductive material by accepting electrons; and depositing the organic semi-conductive material in the channel region between the source and drain electrodes, wherein the dopant moiety has a redox potential of at least 0.3 eV relative to a saturated calomel electrode (SCE) in acetonitrile.

21. A method according to claim 20, comprising depositing the organic semi-conductive material from solution.

* * * * *